United States Patent
Parthasarathy et al.

(10) Patent No.: US 7,071,518 B2
(45) Date of Patent: Jul. 4, 2006

(54) SCHOTTKY DEVICE

(75) Inventors: Vijay Parthasarathy, Phoenix, AZ (US); Vishnu K. Khemka, Phoenix, AZ (US); Ronghua Zhu, Chandler, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/856,602

(22) Filed: May 28, 2004

(65) Prior Publication Data

US 2005/0275055 A1    Dec. 15, 2005

(51) Int. Cl.
*H01L 27/772*    (2006.01)

(52) U.S. Cl. .................. 257/402; 257/348; 257/403

(58) Field of Classification Search ............... 257/109, 257/348, 402–403
See application file for complete search history.

(56) References Cited

U.S. PATENT DOCUMENTS

| | | | | |
|---|---|---|---|---|
| 4,227,098 A | * | 10/1980 | Brown et al. | 307/117 |
| 4,253,162 A | * | 2/1981 | Hollingsworth | 365/156 |
| 6,476,442 B1 | * | 11/2002 | Williams et al. | 257/328 |

FOREIGN PATENT DOCUMENTS

EP    1233456 A2    5/1993

OTHER PUBLICATIONS

S. Kunori, et al., "120V Multi RESURF Junction Barrier Schottky Rectifier (MR-JBS)," IEEE 2002, 0-7803-7318-9/02, pp. 97-100, no month cited.

(Continued)

*Primary Examiner*—Allan R. Wilson
(74) *Attorney, Agent, or Firm*—James L. Clingan, Jr.

(57) ABSTRACT

A regular Schottky diode or a device that has a Schottky diode characteristic and an MOS transistor are coupled in series to provide a significant improvement in leakage current and breakdown voltage with only a small degradation in forward current. In the reverse bias case, there is a small reverse bias current but the voltage across the Schottky diode remains small due the MOS transistor. Nearly all of the reverse bias voltage is across the MOS transistor until the MOS transistor breaks down. This transistor breakdown, however, is not initially destructive because the Schottky diode limits the current. As the reverse bias voltage continues to increase the Schottky diodes begins to absorb more of the voltage. This increases the leakage current but the breakdown voltage is a somewhat additive between the transistor and the Schottky diode.

18 Claims, 2 Drawing Sheets

OTHER PUBLICATIONS

Takashi Shimizu, et al., "100V Trench MOS Barrier Schottky Rectifier Using Thick Oxide Layer (TO-TMBS)," Proceedings of 2001 International Symposium on Power Semiconductor Devices & ICs, vol. 9.18, pp. 243-246, Osaka. 2001, no month cited.

Clarence Severt, et al., "Design of Dual Use, High efficiency, 4H-SIC Schottky and MPS Diodes," Cree, Inc. 2000 published by the American Institute of Aeronautics and Astronautics, Inc., AIAA-2000-2829, pp. 180-184, no month cited.

V. Khemka, et al., "A fully Planarized 4H-SIC Trench MOS Barrier Schottky (TMBS) Rectifier," IEEE Electron Device Letters, May 2000, 0741-31606/00, vol. 21, No. 5, pp. 286-288.

Benjamin Nunes, et al., "No-Cost Reduced-Leakage Schottky Diode by Ion Implantation," IEEE/SEMI Advanced Semiconductor Manufacturing Conference 1999, 0-7803-5217-3/99, pp. 172-177, no month cited.

Jeffrey Smith, et al., "A 0.7 μm Linear BICMOS/DMOS Technology for Mixed-Signal/Power Applications," IEEE 1997, 0-7803-3916-9/97, pp. 155-157, no month cited.

* cited by examiner

US 7,071,518 B2

SCHOTTKY DEVICE

FIELD OF THE INVENTION

This invention relates to semiconductors, and more particularly, to semiconductor devices that can operate like Schottky diodes.

RELATED ART

Schottky diodes have long been found to be useful in a significant number of applications. The Schottky diodes have a lower threshold in the forward biased direction than a PN junction diode which provides for a variety of useful functions. One major disadvantage of typical Schottky diodes is that the leakage current in the reverse biased direction increases exponentially as the reverse bias voltage increases. This effect is sometimes called "barrier lowering." Another characteristic that is generally desirable to improve is the breakdown voltage. A characteristic I-V curve for a Schottky diode is shown in FIG. 1. This a semi-log scale in which the voltage (V) is linear and the current (I) is a log scale. This shows that the current increases exponentially, linear on a log plot, with reverse bias voltage, and there is a breakdown voltage (BV). This breakdown voltage can be increased to as much as 50 volts by decreasing the background doping concentration, but this decreases the forward bias current. Also, due to the exponential increase in leakage current with reverse bias voltage, the leakage current becomes enormous as the breakdown voltage is approached.

To improve this, a technique using very deep doped regions along the sides of the Schottky diode has been developed to "pinchoff" the barrier lowering effect. This has the effect of substantially eliminating barrier lowering and also improving the breakdown voltage. The problem with this approach is that the processing is not simple, and it also results in a significant increase in size of the Schottky diode. It is a vertical solution requiring a very deep and heavily doped region that has a very straight and vertical wall. This is a difficult combination to achieve, and even when the efforts are considered worth doing, it relies on deep contacts. Processes that have this vertical nature, such as bipolar processes and discrete processes, are more amenable to adding the necessary steps to achieve this pinchoff. Other processes that are more lateral, such as CMOS and mixed signal processes, experience much more difficulty and add more cost when attempting to integrate the pinchoff type structure in order to achieve the improved Schottky diode.

Thus, there is a need for a Schottky device with improved leakage and/or breakdown voltage that is simpler for lateral processes to utilize.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a regular Schottky diode or a device that has a Schottky diode characteristic and an MOS transistor are coupled in series to provide a significant improvement in leakage current and breakdown voltage with only a small degradation in forward current. In the reverse bias case, there is a small reverse bias current but the voltage across the Schottky diode remains small due the MOS transistor. Nearly all of the reverse bias voltage is across the MOS transistor until the MOS transistor breaks down. This transistor breakdown, however, is not initially destructive because the Schottky diode limits the current. As the reverse bias voltage continues to increase the Schottky diode begins to absorb more of the voltage. This increases the leakage current but the breakdown voltage is somewhat additive between breakdown voltages of the transistor and the Schottky diode. The net effect is a significantly reduced leakage current and a breakdown voltage that is greater than that of either the transistor or the Schottky diode alone. This is better understood by reference to the figures and the following description.

Figure 2:
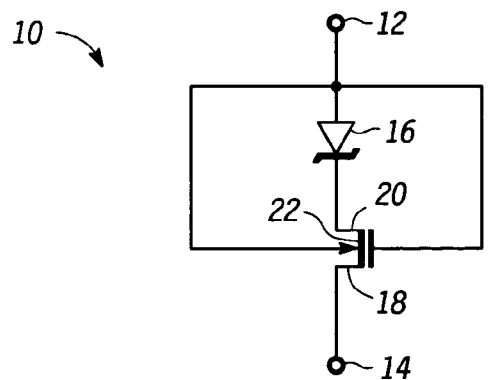
FIG. 2 is a circuit diagram of a Schottky device according to an embodiment of the invention.

Shown in FIG. 2 is a Schottky device 10 comprising a Schottky diode 16, a positive terminal 12, a negative terminal 14, and an N channel transistor 18. The convention used herein is that when Schottky device 10 is forward biased, current flows from positive terminal 12 to negative terminal 14 and when reverse biased, leakage current flows from negative terminal 14 to positive terminal 12. Schottky diode 16 has a positive terminal coupled to positive terminal 12 and a negative terminal. Transistor 18 has a first current electrode connected to the negative terminal of Schottky diode 16 at a contact 20, a gate connected to positive terminal 12, a second current electrode connected to negative terminal 14, a body connected to positive terminal 12, and a channel region 22. The first current electrode of transistor 20 functions as a drain when Schottky device 10 is forward biased and functions as a source when Schottky device 10 is reverse biased. Channel region 22 is doped to make transistor 18 an N channel depletion mode transistor that has a negative threshold voltage of, for example, −0.2 volts. This threshold voltage may be different from that but is preferably negative and thus a depletion mode device.

In forward bias operation, transistor 18 is conductive, because it is a depletion mode device, and the voltage at terminal 12 is more positive than the voltage at terminal 14. Schottky diode 16 becomes conductive at the natural threshold voltage so that Schottky device 10 becomes conductive at the threshold voltage of Schottky diode 16. As the forward bias increases, transistor 18 will become a little more conductive but Schottky diode 16 clamps terminals 12 and 14 in normal Schottky diode fashion so that only minimal voltage increase is possible as the current increases. The body of transistor 18 is tied to the elevated voltage at terminal 12 to aid in the conductivity of transistor 18, but the body could be tied to the first current electrode and the device would still exhibit Schottky diode behaviour. There is a small reduction in forward bias current for Schottky device 10 compared to Schottky diode 16 alone due to transistor 18 adding some resistance, but this can be easily compensated for by slightly increasing the size Schottky diode 16 and adjusting the size of transistor 18 appropriately to achieve the desired forward current.

In reverse bias operation, at any low voltage differential between terminals 12 and 14, transistor 18 will be conductive and Schottky diode 16 will pass a leakage current based on the voltage differential across Schottky diode 16. As the voltage on terminal 14 increases relative to terminal 12, transistor 18 will absorb the voltage. The voltage at contact 20 cannot increase very much relative to terminal 12, otherwise it would cause transistor 18 to be non-conductive. Thus transistor 18 has the effect of clamping the voltage at the negative terminal of Schottky diode. For this example of transistor 18 having a threshold voltage of −0.2 volt, transistor 18 would become non-conductive when the voltage at contact 20 became approximately 0.5 to 1.0 volt greater than the voltage on terminal 12. Thus, the voltage across Schottky diode 16 is clamped at not greater than 0.5 to 1.0 volt. This prevents the leakage current from becoming greater than that for a reverse bias of 0.5 to 1.0 volt across Schottky diode 16 and thereby avoids the exponential increase that would occur if the reverse bias voltage on terminals 12 and 14 were applied across Schottky diode 16.

Figure 3:
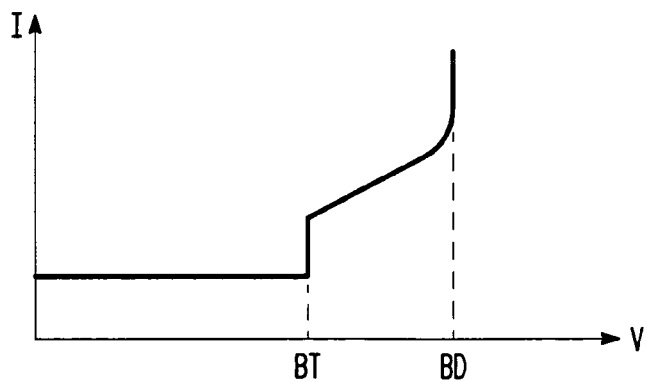
FIG. 3 is a an I-V curve of the Schottky device of FIG. 2.

Shown in FIG. 3 is the I-V curve in the reverse bias direction for Schottky device 10. This shows the initial current associated with a Schottky diode, then the current remains flat until the breakdown voltage BT of transistor 18 is reached. This is due to the fact that transistor 18 continues to absorb substantial voltage so that Schottky diode 16 is reverse biased at significantly less than the reverse bias voltage applied at terminals 12 and 14. When transistor 18 reaches breakdown, there is an increase in current, but this is a non-destructive breakdown at this point because the current is limited by Schottky diode 16. As the reverse bias increases, the current does begin an exponential increase but at a much greater voltage than for just a typical Schottky diode. Ultimately the breakdown voltage BD of the Schottky device 10 is reached.

Figure 4:
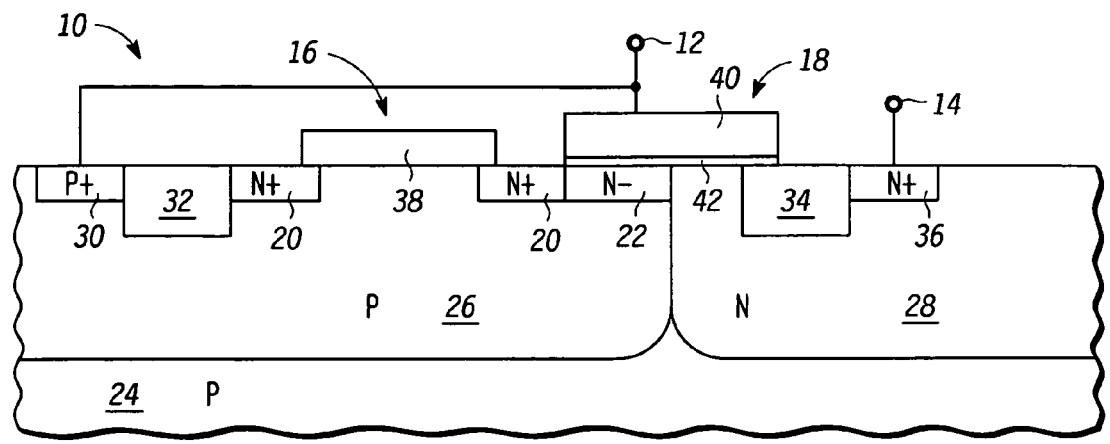
FIG. 4 is a cross section of the Schottky device of FIG. 2 according to a first implementation.

Shown in FIG. 4 is Schottky device 10 of Schottky diode 16 and transistor 18 as a device structure comprising a substrate 24 of P-type silicon, a well 26 of P-type in substrate 24, a well 28 of N-type in substrate 24, a contact region 30 doped to P+, an isolation region 32 adjacent to contact region 30, contact 20 which is an N+ region that encircles a region in well 26 and has a portion adjacent to isolation region 32, channel region 22 that is doped to N− and is adjacent to a portion of contact 20, an isolation region 34 spaced from channel region 22, contact region 36 doped to N+, a metal 38 as the negative terminal of Schottky diode 16 that spans the portion encircled by region 20, a gate 40 over channel region 22 and a portion of isolation 34 as well as the portion of well 53 that is between channel 22 and isolation 34, and a gate dielectric 42 under gate 40. Gate dielectric 42 and gate 40 are designed to overlap both regions 26 and 28. Contact 20 and regions 30, 32, 20, 22, 34, and 36 extend downward a short distance from the surface of substrate 24.

Contact region 30 serves as a contact to well 26 and thus for the body of transistor 18 and the positive terminal of Schottky diode 16. Contact 20 serves as the conventional guard ring for Schottky diode 16, the first current electrode of transistor 18, and as the contact between the negative terminal of Schottky diode 16 and the first current electrode of transistor 18. Channel region 22 extends from well 26 to well 28. Isolation region 34 separates contact region 36 from channel 22 to increase the breakdown voltage of transistor 18. This type of arrangement of a transistor having a well body, such as well 28, be partially under the channel and a region 28 that supports high voltage in the off state between gate 40 and contact 36 is a well known structure for increasing breakdown voltage of a MOS transistor. Contact region 36 is a point of contact for the negative terminal 14 of Schottky device 10.

This device structure shown in FIG. 4 combines a conventional Schottky diode with a conventional high breakdown voltage MOS structure in a manner that achieves the circuit of FIG. 2 and with some efficiencies in integration. The processes needed for this are well known to one of ordinary skill in the art, and one of ordinary skill in the art recognizes that the breakdown voltage is adjustable using this type of structure by adjusting, for example, the width of isolation region 34 and the distance of region 36 from the edge of gate 40. One efficiency in this embodiment of the invention is in using contact region 30 as both the positive terminal contact of the Schottky diode and the body contact of the transistor. Another efficiency is using the conventional guard ring of the Schottky diode as the drain of the transistor and thereby also achieving the contact between the Schottky diode and the transistor. These efficiencies do not introduce process complexities. Thus, it is clear that this is easily achievable using lateral process technologies with no need for the vertical process technologies needed for the pinchoff approach to improving leakage current and breakdown voltage.

Figure 5:
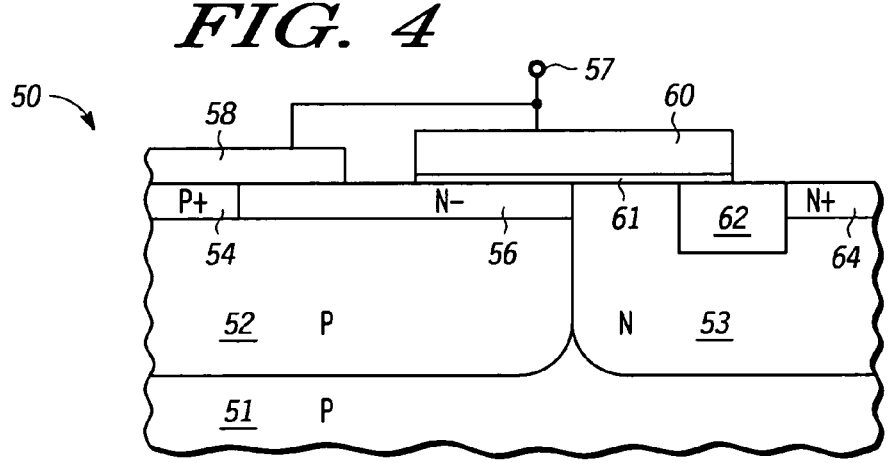
FIG. 5 is a cross section of the Schottky device of FIG. 2 according to a second implementation.

Shown in FIG. 5 is an alternative device structure 50 for achieving the circuit of FIG. 2. Device structure 50 comprises a substrate 51 of P type, a P well 52, an N well 53, a region 54 doped to P+, a region 56 doped to N− adjacent to region 54 and crossing from well 52 to well 53, an isolation 62 spaced from channel region 56, a region 64 that is doped to N+ and adjacent to region 64, a metal 58 over portions of regions 54 and 56, a gate 60 spaced from region 58 and overlying portions of regions 52, 53, and 56 and isolation region 62, and a gate dielectric under gate 60. The implant that creates channel region 56 also is received by well 53 and does increase the N-type doping concentration at the surface of well 53 but not sufficiently to cause it to be N+. In this case the positive terminal of the Schottky diode is metal 58 and the negative terminal is the portion of region 56 under metal 58. The transistor has a first current electrode contact to the Schottky diode through the region 56 in which the gate 60 is spaced from metal 58. The channel that provides for the transistor being depletion mode is the portion of region 56 under gate 60. Well 53, region 62, and region 64 provide for an increased breakdown voltage transistor, and region 64 also provides the contact for the negative terminal of the Schottky device 50. Terminal 57 is contacted to both metal 58 and gate 60 as the positive terminal for Schottky device 50. Region 54 provides for the contact to the body of the transistor to the positive terminal 57 through metal 54. Thus, the connections described for circuit 2 are met with this structure shown in FIG. 5.

Figure 6:
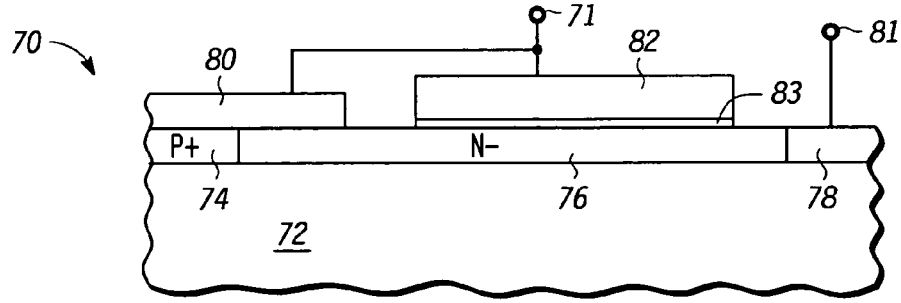
FIG. 6 is a cross section of the Schottky device of FIG. 2 according to a third implementation.

Shown in FIG. 6 is a second alternative Schottky device 70 for forming the circuit of FIG. 2. Schottky device 70 comprises a substrate 72, a region 74 of P+, a region 76 of N− adjacent to region 74, a region of N+ adjacent to region 76, a metal 80 over a portion of region 74 and a portion of region 76, a gate 82 over a portion of region 76 and spaced from metal 80, and a gate dielectric 83 under gate 82. Gate 82 is separated from region 78 by region 76. Positive terminal 71 of Schottky device 70 is connected to both gate 82 and metal 80. The body contact to the transistor is from terminal 71 through metal 80 to region 74 and thereby to substrate 72. Metal 80 is the positive terminal of the Shottky diode. The portion of region 76 under metal 80 is the negative terminal of the Schottky diode. The portion of region 76 where metal 80 and gate 82 are spaced apart is the first current electrode of the transistor as well as the contact between the first current electrode of the transistor and the negative terminal of the Schottky diode. The channel of the transistor is the portion of region 76 under gate 82. The second current electrode is the portion of region 76 that is adjacent to region 78 and not under gate 82. The negative terminal of Schottky device 70 is terminal 81 connected to region 78 which in turn is connected to the second current electrode of the transistor. This approach relies on the portion of region 76 between gate 82 and region 78 to achieve the needed breakdown voltage. Thus, the connections described for circuit 2 are met with this structure shown in FIG. 6.

Figure 1:
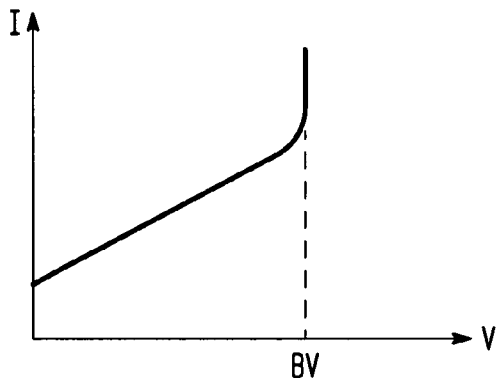
FIG. 1 is an I-V curve of a conventional Schottky diode.

In this description a Schottky diode is considered to be a diode formed of a metal region in contact with a semiconductor region sufficiently doped to form a diode having a forward biased threshold lower than that of a PN junction. A Schottky-like device is a structure having a characteristic curve like that shown in FIG. 1 and includes Schottky diodes and other structures such as that shown in U.S. Pat. No 6,476,442 B1 which is titled "Pseudo-Schottky Diode." A Schottky device is a structure that includes a Schottky-like device and enhancements in which the enhancements improve the performance of the Schottky-like device.

Figure 7:
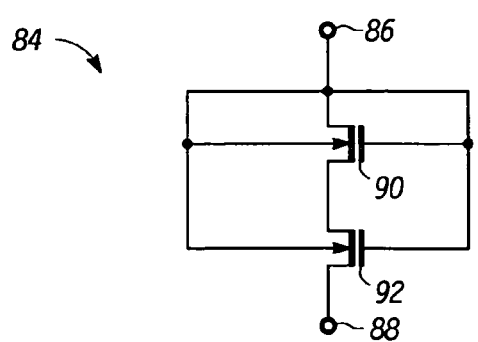
FIG. 7 is a circuit diagram a Schottky device according to an alternative embodiment to that of FIG. 2.

Shown in FIG. 7 is a circuit diagram showing a Schottky device 84 that utilizes a Schottky-like device combined with a depletion transistor in the manner described for combining a Schottky diode and a depletion transistor. Schottky device 84 comprises a transistor 90 and a transistor 92. In this case transistor 90 is a non-depletion transistor with a very low threshold voltage, such as not greater than 0.2 volt, but not a negative one. Transistor 92 is the depletion transistor. In this embodiment both are N channel. Transistor 90 is connected in a manner that it operates as a Schottky-like device. Transistor 90 has a first current electrode connected to terminal 86 which is the positive terminal of Schottky device 84, a gate connected to terminal 86, a body connected to terminal 86, and a second current electrode as the negative terminal of the Schottky-like device. The body, the first current electrode, and the gate of transistor 90, being connected together, operate as the positive terminal of the Schottky-like device. Transistor 92 has a first current electrode connected to the second current electrode of transistor 90, a gate connected to terminal 86, a body connected to terminal 86, and a second current electrode connected to a terminal 88, which is the negative terminal of Schottky device 84.

In the foregoing specification, the invention has been described with reference to specific embodiments. However, one of ordinary skill in the art appreciates that various modifications and changes can be made without departing from the scope of the present invention as set forth in the claims below. For example, other semiconductor materials different from silicon may be used as the substrate. The conductivity types may be reversible to achieve similar results. The metal used for the Schottky diodes may be a different metal from cobalt silicide. Where two things have been described as being connected they could also be coupled by an intervening structure instead of directly connected. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A Schottky device having a positive terminal and a negative terminal, comprising:
    a Schottky-like device having a positive terminal and a negative terminal, wherein the positive terminal of the Schottky-like device operates as the positive terminal of the Schottky device; and
    a depletion transistor having a first current electrode coupled to the negative terminal of the Schottky-like device, a gate coupled to the positive terminal of the Schottky-like device, and a second current electrode that operates as the negative terminal of the Schottky device,
    wherein the Schottky-like device comprises a transistor having a first current electrode, a gate, and body tied together to form the positive terminal of the Schottky-like device and a second current electrode as the negative terminal of the Schottky-like device.

2. The Schottky device of claim 1, wherein the transistor is a non-depletion transistor with a threshold voltage not greater than 0.2 volt.

3. A Schottky device having a positive terminal and a negative terminal, comprising:
    a Schottky-like device having a positive terminal and a negative terminal, wherein the positive terminal of the Schottky-like device operates as the positive terminal of the Schottky device; and
    a depletion transistor having a first current electrode coupled to the negative terminal of the Schottky-like device, a tate coupled to the positive terminal of the Schottky-like device, and a second current electrode that operates as the negative terminal of the Schottky device,
    wherein the Schottky device is formed in a semiconductor region of a substrate having:
    a first well region of the first conductitivity type;
    a second well region of the second conductivity type adjacent to the first well;
    a first doped region that is the first conductivity type, located at the surface of the substrate, and coupled to the first positive terminal of the Schottky device, more heavily doped than the first well region, and in the first well region;
    a metal on a first portion of the first well that forms a Schottky diode, wherein the metal is the negative terminal of the Schottky diode and the first portion of the first well is the positive terminal of the Schottky diode;
    a first isolation region in the first well region between the first portion of the first well region and the first doped region;

a channel region that is of the second conductivity type, spaced from the first portion of the first well region, in the first well region, and at the surface of the substrate;

a gate that is over the channel region;

a second doped region that is the second conductivity type, the first current electrode of the depletion transistor, more heavily doped than the channel region, and adjacent to and in contact with the channel region and that has at least a portion under and in contact with the metal;

a third doped region that is spaced from the channel region, the second conductivity type, the second current electrode of the depletion transistor, at the surface of the substrate, in the second well region, and the negative terminal of the Schottky device; and a second isolation region between the channel region and the third doped region.

4. The Schottky device of claim 3, wherein the second conductivity type is N-type.

5. The Schottky device of claim 4, wherein the metal is cobalt silicide.

6. The Schottky device of claim 1, wherein the Schottky device is formed in a semiconductor region of a substrate having:

a first well region of the first conductitivity type;

a second well region of the second conductivity type adjacent to the first well;

a metal on a first portion of the first well, the metal being coupled to the positive terminal of the Schottky device;

a first doped region in the first well region having the second conductivity type, located at the surface of the substrate, and having a first portion under a portion of the metal, wherein the portion of the first doped region under the portion of the metal is a negative terminal of a Schottky diode and the metal is a positive terminal of the Schottky diode;

a gate, which is over a second portion of the first doped region, that is coupled to the positive terminal of the Schottky device;

a second doped region that is the second conductivity type, the second current electrode of the depletion transistor, at the surface of the substrate, in the second well region, the negative terminal of the Schottky device, and spaced from the first doped region; and an isolation region in the second well region that is spaced from the first doped region and is between the first doped region and the second doped region.

7. The Schottky device of claim 6, wherein the second conductivity type is N type.

8. The Schottky device of claim 6, further comprising a third doped region of the first conductivity type in the first well region that is more heavily doped than the first well region, is at the surface of the substrate, and is under a second portion of the metal.

9. The Schottky device of claim 1, wherein the Schottky device is formed in a semiconductor region of a substrate of a first conductivity type having:

a metal on the substrate, the metal being coupled to the positive terminal of the Schottky device;

a first doped region in the substrate having the second conductivity type, located at the surface of the substrate, and having a first portion under a portion of the metal, wherein the portion of the first doped region under the portion of the metal is a negative terminal of a Schottky diode and the metal is a positive terminal of the Schottky diode;

a gate, which is over a second portion of the first doped region, that is coupled to the positive terminal of the Schottky device;

a second doped region that is the second conductivity type, the second current electrode of the depletion transistor, at the surface of the substrate, in the substrate, the negative terminal of the Schottky device, and spaced from the first doped region; and an isolation region in the second well that is spaced from the first doped region and is located between the first doped region and the second doped region.

10. The Schottky device of claim 9, wherein the second conductivity type is N type.

11. The Schottky device of claim 10, wherein further comprising a third doped region of the first conductivity type in the substrate that is more heavily doped than the substrate, is at the surface of the substrate, and is under a second portion of the metal.

12. A Schottky device having a positive terminal and a negative terminal, comprising:

substrate having a semiconductor region;

a first well region of the first conductivity type in the semiconductor region;

a second well region of the second conductivity type adjacent to the first well and in the semiconductor region;

a first doped region that is the first conductivity type, located at the surface of the substrate, more heavily doped than the first well region, coupled to the positive terminal, and in the first well region;

a metal on a first portion of the first well region;

a first isolation region in the first well region between the first portion of the first well region and the first doped region;

a channel region that is of the second conductivity type, spaced from the first portion of the first well, in the first well, and at the surface of the substrate;

a gate that is over the channel region;

a second doped region that is in the first well region, the second conductivity type, more heavily doped than the channel region, and adjacent to and in contact with the channel region and that has at least a portion under and in contact with the metal;

a third doped region that is spaced from the channel region, the second conductivity type, at the surface of the substrate, in the second well region, and the negative terminal of the Schottky device; and a second isolation region between the channel region and the third doped region.

13. The Schottky device of claim 12, wherein the second isolation region is further characterized as being spaced from the channel region.

14. The Schottky device of claim 12, further comprising a fourth doped region of the second conductivity type between the first portion of the first well region and the first isolation region.

15. The Schottky device of claim 15, wherein the second conductivity type is N type.

16. A Schottky device having a first terminal and a second terminal, comprising:

a Schottky-like device having a first terminal coupled to the first terminal of the Schottky device and a second terminal; and a transistor having a gate coupled to the first terminal of the Schottky device, a first current electrode coupled to the second terminal of the Schottky-like device, and a second current electrode coupled to the second terminal of the Schottky devices;

wherein the Schottky-like device is a low threshold voltage transistor having a first current electrode, a gate, and body tied together to form the first terminal of the Schottky-like device and a second current electrode as the second terminal of the Schottky-like device.

17. The Schottky device of claim 16, wherein the transistor is a depletion transistor.

18. The Schottky device of claim 16, wherein the first terminal of the Schottky-like device is a positive terminal and the second terminal of the Schottky-like device is a negative terminal.

* * * * *